(12) United States Patent
Lux et al.

(10) Patent No.: US 10,480,988 B2
(45) Date of Patent: Nov. 19, 2019

(54) CALIBRATION UNIT AND METHOD FOR METERING A DOSAGE UNIT

(71) Applicant: Harro Hoefliger Verpackungsmaschinen GmbH, Allmersbach im Tal (DE)

(72) Inventors: Andreas Lux, Allmersbach im Tal (DE); Jonas Hoepfer, Allmersbach im Tal (DE); Benedict Kleine-Koenig, Winnenden (DE)

(73) Assignee: Harro Hoefliger Verpackungsmaschinen GmbH, Allmersbach im Tal (DE)

( * ) Notice: Subject to any disclaimer, the term of this patent is extended or adjusted under 35 U.S.C. 154(b) by 224 days.

(21) Appl. No.: 15/666,316

(22) Filed: Aug. 1, 2017

(65) Prior Publication Data

US 2018/0031410 A1 Feb. 1, 2018

(30) Foreign Application Priority Data

Aug. 1, 2016 (EP) ..................... 16001694

(51) Int. Cl.
| | |
|---|---|
| G01F 25/00 | (2006.01) |
| A61J 3/06 | (2006.01) |
| G01F 11/00 | (2006.01) |
| G01R 27/26 | (2006.01) |

(52) U.S. Cl.
CPC ............ *G01F 25/0092* (2013.01); *A61J 3/06* (2013.01); *G01F 11/003* (2013.01); *A61J 2200/70* (2013.01); *G01R 27/2605* (2013.01)

(58) Field of Classification Search
CPC ...... G01F 11/003; G01F 11/10; G01F 11/284; G01F 25/0092; A61J 3/06; A61J 2200/70
USPC ........................................................... 73/1.36
See application file for complete search history.

(56) References Cited

U.S. PATENT DOCUMENTS

| | | | |
|---|---|---|---|
| 4,223,751 A | 9/1980 | Ayers et al. | |
| 4,381,663 A * | 5/1983 | Swanson | G01N 3/36 73/168 |
| 4,430,285 A * | 2/1984 | Runyan | F16K 27/067 264/242 |
| 4,461,363 A | 7/1984 | Loy | |
| 5,827,984 A * | 10/1998 | Sinnreich | B01F 1/0011 73/866 |
| 7,449,342 B2 | 11/2008 | Kane et al. | |
| 8,573,027 B2 | 11/2013 | Rosinko et al. | |
| 2004/0146434 A1 | 7/2004 | Kane et al. | |
| 2008/0253935 A1 | 10/2008 | Kane et al. | |

(Continued)

*Primary Examiner* — Benjamin R Schmitt
(74) *Attorney, Agent, or Firm* — Walter Ottesen, P.A.

(57) ABSTRACT

A calibration unit is for a capacitive measuring system in a metering installation, or a metering installation for in particular solid pharmaceutical dosage units, and to an associated method for metering. The calibration unit includes a test body, a drive for the test body, and a guide for the test body. The guide has a first terminal position, a second terminal position, and a guided section that runs between the two terminal positions. The drive is configured for moving the test body along the guided section in a reciprocating manner between the two terminal positions. The capacitive measuring system is calibrated via the calibration unit. The dosage units are then metered via the metering installation and checked for a properly metered mass via the calibrated capacitive measuring system.

7 Claims, 1 Drawing Sheet

(56) References Cited

U.S. PATENT DOCUMENTS

2009/0056826 A1 3/2009 Mertens et al.
2009/0261128 A1 10/2009 Williams et al.
2010/0218586 A1 9/2010 Rosinko et al.

\* cited by examiner

CALIBRATION UNIT AND METHOD FOR METERING A DOSAGE UNIT

CROSS REFERENCE TO RELATED APPLICATION

This application claims priority of European patent application no. 16 001 694.5, filed Aug. 1, 2016, the entire content of which is incorporated herein by reference.

FIELD OF THE INVENTION

The invention relates to a calibration unit for a capacitive measuring system, to a metering installation having a capacitive measuring system and having a calibration unit, and to a method for metering in particular solid pharmaceutical dosage units via the metering installation.

BACKGROUND OF THE INVENTION

Exact and repeatable metering of dosage units is important for example in the pharmaceutical sector, in order for the patient to take the exact envisaged quantity of an active ingredient. Solid dosage forms can be, for example, pills, or pulverulent quantities or pellets, respectively, that are provided in gelatine capsules. Of course, any other solid-type dosage forms are also to be considered. In any case, the metering of such dosage units is typically performed by volumetric means, wherein a specific target mass is aimed for by way of a specific measured volume and the density of the material. Ultimately, however, it is not the volume but rather the mass of the individual dosage units that is actually achieved in the metering that is important. Density variations in the material, incomplete filling or emptying of the volumetric measuring chamber and the like can lead to undesirable variations in the target mass. A reliable process control is therefore necessary in particular in the case of critical active ingredients.

Various control steps can be considered for controlling a proper sequence of the metering procedure. A first optional control step can be performed via a capacitive measuring section, for example. The latter can produce qualitative statements pertaining to the metering process and assist in locating process errors. Gravimetric measurements in which the dosage units that were previously measured in volumetric terms are individually weighed are performed for quantitative controlling of the metering result. The individual dosage units have to be brought to rest for the static procedure of weighing. However this is in contrast to the high conveying velocities in the case of metering on an industrial scale. Process control to the extent of 100 percent as is occasionally required can thus be implemented only with difficulty and with high expenditure.

SUMMARY OF THE INVENTION

It is an object of the invention to provide a suitable device for a reliable and repeatable determination of mass of, in particular, solid pharmaceutical dosage units.

This object can, for example, be achieved by a calibration unit for a capacitive measuring system in a metering installation having: a test body; a drive for the test body; a guide for the test body; the guide having a first terminal position, a second terminal position, and a guided section running between the first terminal position and the second terminal position; and, the drive being configured to move the test body along the guided section in a reciprocating manner between the first terminal position and the second terminal position.

The object can, for example, further be achieved by a metering unit including: a capacitive measuring system; a calibration unit having a test body, a drive for the test body, and a guide for the test body; the guide having a first terminal position, a second terminal position, and a guided section running between the first terminal position and the second terminal position; the drive being configured to move the test body along the guided section in a reciprocating manner between the first terminal position and the second terminal position; the capacitive measuring system having a measurement duct for dosage units; and, the guide being configured to be positioned in the measurement duct.

It is further an object of the invention to provide a metering method that is suitable for mass production and via which the desired target masses of the dosage units can be maintained in a reliable and repeatable manner.

This object can, for example, be achieved by a method for metering dosage units via a metering unit having a capacitive measuring system, a calibration unit having a test body, a drive for the test body, and a guide for the test body; the guide having a first terminal position, a second terminal position, and a guided section running between the first terminal position and the second terminal position; and, the drive being configured to move the test body along the guided section in a reciprocating manner between the first terminal position and the second terminal position; the capacitive measuring system having a measurement duct for dosage units; and, the guide being configured to be positioned in the measurement duct. The method includes the steps of: calibrating the capacitive measuring system via the calibration unit; and, metering the dosage units via the metering unit and thereby checking the dosage unit via the calibrated capacitive measuring system for a properly metered mass.

The invention is based on the concept of employing a capacitive measuring system and of calibrating the latter in such a manner that the capacitive measuring system can be employed with sufficient accuracy and reliability for the determination of mass of the dosage units that have previously been individually measured.

To this end, the metering installation according to the invention has a calibration unit, a test body, a drive for the test body, and a guide for the test body. The guide for the test body includes a first terminal position, a second terminal position, and a guided section for the test body that runs between the two terminal positions. The drive is configured for moving the test body along the guided section in a reciprocating manner between the two terminal positions. For the calibration procedure, the guide mentioned is positioned in the measuring duct of the capacitive measuring system. The test body which has known dielectric properties that have previously been determined is now moved at least once, preferably multiple times along the guided section in a reciprocating manner between the two terminal positions, wherein the test body passes the measuring section of the capacitive measuring system a corresponding number of times. The test body herein acts as the test standard, wherein the associated measured result of the capacitive measuring system is utilized as the calibrated measured value. The dosage units that are measured in the regular operation are now measured in a capacitive manner via a capacitive measuring system that has been calibrated in such a manner when passing through the measuring section, on account of which an exact determination of the mass of the individual dosage units is possible in conjunction with the calibration that has previously been carried out.

It has been demonstrated that measured results having extraordinarily precise and repeatable measured values can be achieved by way of the devices according to the invention, or by way of the method according to the invention, respectively. Standard deviations of <0.5% within one test series are readily achievable. The relevant classification prerequisites in particular in the pharmaceutical sector are met in terms of reliability and accuracy. Weighing procedures which are static and thus slow can be dispensed with. Rather, the calibrated determination of mass is performed in a dynamic manner when the dosage unit passes through the measuring section of the capacitive measuring system, without the overall metering procedure being slowed down. A determination of mass of each individual dosage unit can thus be performed in the context of a 100-percent in-process control.

Various embodiments can be considered for the guide of the test body. The guide is preferably a guide tube that encloses the test body, on account of which the movement of the test body can be very positively controlled. In the case of a respective adaptation to the cross section of the measuring duct, the guide tube can also serve as a centering means for the test body such that the latter is guided coaxially to the measuring duct with high accuracy. Moreover, the velocity of the movement of the test body in the guide tube can be adapted in an exact manner.

The drive for the test body can be mechanical, electromagnetic or the like, and is preferably embodied as a pneumatic drive. It can suffice herein that an air blast that acts in a pneumatic manner only acts on one side while the test body in the opposite direction drops back, for example under the influence of gravity. However, the drive expediently is a pneumatic drive that acts on the test body on both sides and which enables an exact adaptation of the velocity, or an adjustment of the velocity, respectively, in both directions of movement. Preferably, the velocity of the dosage units is initially determined when passing through the measuring section of the capacitive measuring system. In the calibration procedure, the test body is then moved at the at least approximately identical velocity as the previously determined passing velocity of the dosage units. It has been demonstrated herein that the desirable velocities can be adjusted very exactly, in particular via the pneumatic drive. Overall, the correlation between the calibration measurements and the actual measurements in the ongoing metering process can be improved on account thereof.

In a preferred embodiment, the test body is of plastics and in particular of PEEK (polyether ether ketone). The same also applies to the material of the guide which can likewise be made of such plastics. Alternatively, the guide can also be of glass, wherein other materials can also be considered, however. In any case, the dielectric properties of the preferred materials are very close to the dielectric properties of the materials to be metered, this likewise contributing toward a positive correlation between the calibration measurements and the later operational measurement. In particular, the test body and the guide are of the same material, this simplifying the isolation or separation, respectively, of the signal that is generated by the test body from the influence on the signal by the guide.

Various construction modes can be considered for the calibration unit. A construction mode in which the calibration unit has a plier-shaped holding element having two holding arms has proven to be particularly expedient. In operation, the plier-shaped holding element encompasses the main body of the capacitive measuring system in such a manner that the one holding arm comes to lie above the main body, and the other holding arm comes to lie below the main body. The guide of the test body that is routed through the measuring duct is held by the upper and by the lower holding arm. Moreover, the two holding arms are each provided with part of the drive in such a manner that the test body can be moved so as to proceed from one holding arm in the direction toward the opposite holding arm. The direction of movement of the test body is then reversed at the latter, such that the test body is moved from the opposite holding arm back to the initial position of the test body. This process can be repeated sufficiently often until a statistically significant number of measured values has been determined. The plier shape mentioned permits an exact and repeatable positioning of the guide and of the test body in the measuring duct, while it is ensured at the same time that the test body can be moved in both directions of movement at the desired velocity.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
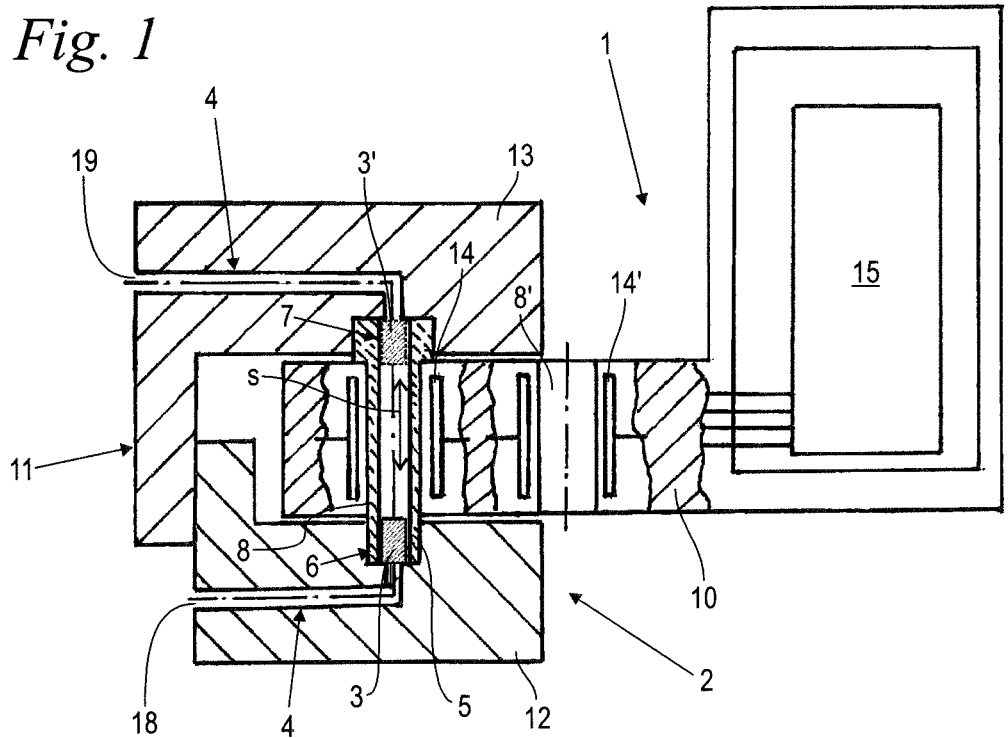
FIG. 1 shows a metering installation according to the invention for the metering of dosage units, having a capacitive measuring system and an associated calibration unit, in a schematic general view; and, FIG. 2 shows the calibrated metering installation as per FIG. 1 in the regular metering operation in conjunction with a capacitive test of mass of the individual dosage units.
Figure 2:
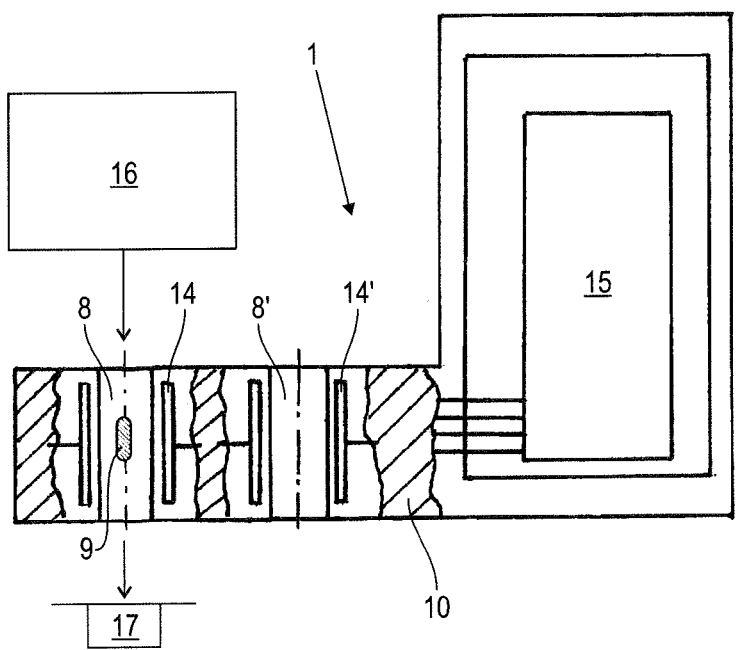

FIGS. 1 and 2 when viewed together show a schematic sectional illustration of the metering installation according to the invention in two different configurations. Apart from a schematically indicated metering unit 16 (FIG. 2), the metering installation according to the invention includes a capacitive measuring system 1 and a calibration unit 2 (FIG. 1) for the capacitive measuring system 1. The metering installation is conceived for metering in particular solid pharmaceutical dosage units 9 (FIG. 2), for testing the latter in terms of the mass that is actually achieved in an individual dosage unit 9, and for transferring the latter into a target container 17. The pharmaceutical dosage units 9 mentioned can be pills, pellets, compressed powder slugs, or the like. Blister packs, gelatine capsules or the like, or else intermediate containers for further processing, for example, can be considered as target containers 17 (FIG. 2).

Reference is first made to FIG. 2 in which the metering installation according to the invention is shown in a usual operating configuration. An in particular volumetric metering of a measured part-quantity of a powder or a granulate, for example, is performed in the metering unit 16 that is indicated in only a schematic manner, while a schematically indicated dosage unit 9 is being formed. This dosage unit 9 can be blown out of the metering unit 16 toward the target container 17. Alternatively or additionally, the force of weight can be utilized to permit the dosage unit 9 to drop from the metering unit 16 into the target container 17.

For a 100-percent in-process control, the individual dosage units 9 on their way from the metering unit 16 to the target container 17 pass the measuring section of the capacitive measuring system 1 that has already been mentioned at the outset. To this end, the capacitive measuring system 1 includes a main body 10 having at least one measuring duct 8 configured therein, this measuring duct 8 presently being aligned so as to be vertical in the direction of gravity. The measuring section of a schematically indicated capacitive measuring sensor 14 which is connected to an evaluation unit 15 is located in the measuring duct 8. As a result of a calibration of the capacitive measuring system 1, as will yet be described hereunder, the mass of each individual dosage unit 9 can be determined in the evaluation unit 15 with high precision and repeatable accuracy via the measuring signal that is generated by the passage of the dosage unit 9 and is received by the capacitive measuring sensor 14.

A further measuring duct 8' having a further capacitive measuring sensor 14' can be optionally disposed in parallel with the measuring duct 8. This additional measuring duct 8' herein is employed as a compensating duct for compensating atmospheric variations, for example, such that the latter remain without any influence on the measured result determined. It is to be furthermore noted that only one pair of measuring ducts 8, 8' having capacitive measuring sensors 14, 14' are shown herein for the sake of simplicity. In practice, a multi-row metering unit 16 having for example twelve metering outlets that lie beside one another is used. Accordingly, a corresponding number of measuring ducts 8 and optionally also additional measuring ducts 8' are then configured in the main body 10 of the capacitive measuring system 1.

In order for a reliable factual statement pertaining to the actually achieved mass of each individual dosage unit 9 to actually be able to be made from the measured result of the capacitive measuring system 1, a calibration unit 2 and an associated calibration method for calibrating the capacitive measuring system 1 are provided according to the invention, as can be derived from the schematic illustration as per FIG. 1. For improved clarity, the capacitive measuring system 1 as per FIG. 2 is shown here in interaction with the calibration unit 2 according to the invention, with the metering unit 16 and the target container 17 being omitted. The calibration unit 2 includes a test body 3, a drive 4 for the test body 3, and a guide 5 for the test body 3. The guide 5 for the calibration process is positioned in the measuring duct 8 in such a manner that the test body 3 is able to be moved through the measuring section of the capacitive measuring sensor 14. It can suffice herein that the guide 5 can protrude into the measuring duct 8 from only one side. The guide 5 in the embodiment shown is routed completely through the measuring duct 8 and is held on both sides. To this end, the calibration unit 2 has a plier-shaped holding element 11 having two holding arms 12, 13, wherein in the calibrating operation according to FIG. 1 the one holding arm 12 is disposed below the main body 10 and the other holding arm 13 is disposed above the main body 10. Both holding arms 12, 13 in terms of their axial spacing are adjustable such that the holding arms 12, 13 tightly enclose the main body 10 of the capacitive measuring system 1 in the region of the measuring duct 8. The guide 5 for the test body 3 is held above the main body 10 on the upper holding arm 13, and below the main body 10 on the lower holding arm 12. Additionally, it can be expedient for an identical guide 5, but without a test body 3, to be introduced into the additional measuring duct 8' that is provided for compensation.

The guide 5 can be a rail or the like, and in the embodiment shown is configured as a guide tube that encloses the test body 3. The guide tube in terms of the external contour thereof corresponds to the cross-sectional contour of the measuring duct 8 to the extent that centering means for centering the guide 5 in the measuring duct 8 are formed on account thereof. However, it can also be expedient for the external diameter of the guide tube to be chosen to be smaller than the internal diameter of the measuring duct 8. The use of separate centering means is expedient in this case. The guide 5 or the guide tube, respectively, per se encloses the test body 3 with such a minor clearance that the test body 3 can be moved along the longitudinal axis of the measuring duct 8 with sufficient accuracy.

The test body 3 in FIG. 1 is shown in a lower terminal position 6, to which end a respective detent that acts in a downward manner on the test body 3 is configured in the holding element 11. A further upper terminal position 7 having a detent for the test body 3 that acts in the opposite direction is located at the opposite end of the guide 5 or of the guide tube, respectively. A guided section s runs between the two terminal positions 6, 7. The test body 3, proceeding from the lower terminal position 6 thereof, can be moved along the guided section s where the test body referenced as 3' then comes to lie on the detent of the upper terminal position 7, and from where the test body can be moved back to the initial position thereof in the form of the lower terminal position 6. In other words, the test body 3 is moved along the guided section s in a reciprocal manner between the two terminal positions 6, 7. The guided section s in the preferred embodiment shown runs vertically. However, an inclined or even a horizontal alignment of the measuring duct 8 and of the guided section s can also be expedient. In any case, the guided section s runs in an axially parallel and in particular coaxial manner to the longitudinal axis of the measuring duct 8, this applying in an analogous manner also to the direction of movement of the test body 3.

The drive 4 is configured for moving the test body along the guided section s in a reciprocating manner between the two terminal positions 6, 7. Drive means that act on one side and lift the test body 3 for example from the lower terminal position 6 to the upper terminal position 7 can be expedient to this end. It can suffice in this instance for the test body 3 in the opposite direction to drop back to the lower terminal position 6 as a result of the active force of weight. The drive 4 in the preferred embodiment shown acts on the test body 3 on both sides such that the latter is moved actively in a reciprocating manner in both directions. Mechanical tappets, electromagnetic drives, or the like, can be expedient to this end. The drive in the preferred embodiment shown is embodied as a pneumatic drive which acts on the test body 3 on both sides. To this end, the two holding arms 12, 13 each are provided with part of the drive 4. This means in detail that a first compressed-air duct 18 runs through the lower holding arm 12 to the lower end of the guide tube 5, while a second compressed-air duct 19 is configured in the upper holding arm 13 and runs to the upper end of the guide tube, or to the guide 5, respectively. Compressed air from a compressed-air source (not illustrated) can now be fed into one of the two compressed-air ducts 18, 19 in an alternating manner via a control-valve installation (likewise not illustrated), the test body 3 as a result thereof being blown between the two terminal positions 6, 7 of the guide tube in a reciprocating horizontal or vertical manner, respectively, within the guide tube. It has been determined in the metering operation as per FIG. 2 at what velocity the dosage units 9 pass or drop through, respectively, the measuring section of the capacitive measuring sensors 14. In the calibrating operation as per FIG. 1 the compressed-air feed of the drive 4 is now adapted in such a manner that the test body 3 is moved in a reciprocating manner in the guide 5 and thus through the measuring section of the capacitive measuring sensor 14 at almost approximately the same velocity as the dosage unit 9.

The test body 3 and the guide 5 in the embodiment shown are made from the same material. The guide 5, or the guide tube that is provided to this end, respectively, like the test body 3 is formed from plastics, specifically from PEEK. However, other materials can also be expedient. For example, glass can be expedient as a material for very thin guide tubes in very tight measuring ducts 8. In any case, materials which in terms of the dielectric properties thereof that act on the capacitive measuring sensors 14 are as close to the dielectric properties of the dosage units 9 (FIG. 2) as possible are aimed for.

The calibration of the capacitive measuring system 1 is performed according to the invention as follows. A specific and in terms of the properties thereof known test body 3 is initially moved in a reciprocating manner multiple times between the terminal positions 6, 7 thereof. The guided section s herein is dimensioned and positioned such that the test body passes completely through the effective measuring section of the associated capacitive measuring sensor 4. The measuring signals of the capacitive measuring sensor 14 that are created thereby are evaluated in the evaluation unit 15. The number of passages of the test body 3 through the measuring section of the capacitive measuring sensor 14 is chosen such that the evaluation of the assigned individual measurements in the evaluation unit 15 is statistically significant. It has been proven expedient for the same test body 3 to be moved in a reciprocating manner between the two terminal positions 6, 7 thereof at least 20 times, preferably 30 times.

The aforementioned procedure is now preferably repeated with at least two further test bodies 3, wherein all three or more test bodies 3 that are employed differ in one parameter that influences the mass. For example, the test bodies 3 can have a substantially cylindrical external contour, wherein the external diameter remains the same but the length of the test bodies 3 is varied. The at least three different lengths then result in a corresponding number of masses of the test bodies 3. This enables the quality of the measuring linearity of the capacitive measuring system 1 within a specific measuring range to be determined in the evaluation unit 15. It is thus not a calibration for just a specific target mass but for a measuring range of the mass within which sufficient linearity is available that is performed.

In order for the calibration to be carried out for as large a measuring range as possible, the variation in an additional mass-relevant parameter of the test body 3 can be expedient. For example, substantially tubular test bodies 3 can be employed wherein, apart from the length, the wall thickness can also be varied. A test matrix of three different lengths multiplied by three different wall thicknesses of the test body 3 can thus be established, for example. In the aforementioned example, nine different test bodies 3 having all possible combinations of the three different lengths of the three different wall thicknesses are thus employed. Each of these test bodies 3 is then moved multiple times in a reciprocating manner between the terminal positions 6, 7, as has been described above, so as to obtain a significant number of measured results. The combination of two parameters with in each case at least three different values is stated here in a merely exemplary manner. Three or more mass-relevant parameters of the test body 3 can also be varied. In any case, each parameter should be varied in terms of at least three values so as to not only derive a large measuring range therefrom but so as to also be able to make a statement pertaining to the quality of the measuring linearity within the measuring range.

In any case, test bodies 3 having known dielectric properties are employed, the test bodies 3 being utilized as the test standard such that the measured values that are determined thereby in the capacitive measuring system 1 can be utilized for calibrating. It has been demonstrated that mass determinations of individual dosage units 9 that are exact, repeatable and reliable within a wide spread of measuring ranges are possible as a result of the calibration according to the invention.

It is understood that the foregoing description is that of the preferred embodiments of the invention and that various changes and modifications may be made thereto without departing from the spirit and scope of the invention as defined in the appended claims.

What is claimed is:

1. A metering unit comprising:
a capacitive measuring system;
a calibration unit having a test body, a drive for said test body, and a guide for said test body;
said guide having a first terminal position, a second terminal position, and a guided section running between said first terminal position and said second terminal position;
said drive being configured to move said test body along said guided section in a reciprocating manner between said first terminal position and said second terminal position;
said capacitive measuring system having a measurement duct for dosage units; and,
said guide being configured to be positioned in said measurement duct.

2. The metering unit of claim 1 further comprising a centering device configured to center said guide in said measurement duct.

3. The metering unit of claim 1, wherein:
said measurement duct is a continuous measuring duct;
said capacitive measuring system has a main body including said continuous measuring duct;
said calibration unit has a plier-shaped holding element including a first holding arm and a second holding arm;
said first holding arm is disposed below said main body;
said second holding arm is disposed above said main body;
said guide is routed through said measurement duct;
said first holding arm and said second holding arm hold said guide between said first holding arm and said second holding arm; and,
said first holding arm and said second holding arm are each provided with a part of said drive.

4. The metering unit of claim 1, wherein the metering unit is configured for solid pharmaceutical dosage units.

5. A method for metering dosage units via a metering unit having a capacitive measuring system, a calibration unit having a test body, a drive for the test body, and a guide for the test body; the guide having a first terminal position, a second terminal position, and a guided section running between the first terminal position and the second terminal position; and, the drive being configured to move the test body along the guided section in a reciprocating manner between the first terminal position and the second terminal position; the capacitive measuring system having a measurement duct for dosage units; and, the guide being configured to be positioned in said measurement duct; the method comprising the steps of:
calibrating the capacitive measuring system via the calibration unit; and, metering the dosage units via the metering unit and thereby checking the dosage unit via the calibrated capacitive measuring system for a properly metered mass.

6. The method of claim 5, wherein said test body is moved back and forth between said first terminal position and said second terminal position multiple times.

7. The method of claim 5 further comprising the steps of:
determining the velocity of the dosage units when passing through a measuring section of the capacitive measuring system; and,
moving said test body at the same velocity as the dosage units.

\* \* \* \* \*